(12) United States Patent
Okamoto (10) Patent No.: US 10,359,483 B2
(45) Date of Patent: Jul. 23, 2019

(54) MAGNETIC RESONANCE IMAGING APPARATUS AND RADIO FREQUENCY COIL UNIT

(71) Applicant: Toshiba Medical Systems Corporation, Otawara-shi (JP)

(72) Inventor: Kazuya Okamoto, Chuo (JP)

(73) Assignee: Toshiba Medical Systems Corporation, Otawara-shi (JP)

( * ) Notice: Subject to any disclaimer, the term of this patent is extended or adjusted under 35 U.S.C. 154(b) by 573 days.

(21) Appl. No.: 14/633,753

(22) Filed: Feb. 27, 2015

(65) Prior Publication Data

US 2015/0253399 A1   Sep. 10, 2015

(30) Foreign Application Priority Data

Mar. 10, 2014   (JP) .................. 2014-046219

(51) Int. Cl.
  *G01R 33/36*  (2006.01)
  *G01R 33/3415*  (2006.01)

(52) U.S. Cl.
  CPC ...... *G01R 33/3664* (2013.01); *G01R 33/3415* (2013.01)

(58) Field of Classification Search
  CPC .......................... G01R 33/36; G01R 33/3664; G01R 33/3415; G01R 33/341; G01R 33/34
  USPC ......................................................... 324/322
  See application file for complete search history.

(56) References Cited

U.S. PATENT DOCUMENTS

| 4,649,348 A * | 3/1987 | Flugan ............. G01R 33/34069 324/309 |
| 7,598,740 B2 | 10/2009 | Fischer et al. |
| 8,773,131 B2 | 7/2014 | Mitsui et al. |
| 2007/0285199 A1* | 12/2007 | Okamoto ........... G01R 33/3415 335/296 |
| 2008/0129296 A1* | 6/2008 | Fischer ............. G01R 33/3664 324/318 |

FOREIGN PATENT DOCUMENTS

| CN | 101226230 A | 7/2008 |
| JP | 2010 94156 | 4/2010 |
| JP | 2010 269130 | 12/2010 |

OTHER PUBLICATIONS

Combined Office Action and Search Report dated Mar. 2, 2017 in Chinese Patent Application No. 201510103308.3 (with English translation of categories of cited documents).

(Continued)

*Primary Examiner* — Melissa J Koval
*Assistant Examiner* — Courtney McDonnough
(74) *Attorney, Agent, or Firm* — Oblon, McClelland, Maier & Neustadt, L.L.P.

(57) ABSTRACT

According to one embodiment, a radio frequency coil unit includes coil elements, first switching parts and second switching parts. The coil elements are arranged in a first direction and a second direction. Each of the first switching parts and each of the second switching parts are installed in a corresponding coil element of the coil elements and switch the corresponding coil element between an on state and an off state. At least two of the first switching parts are connected in series in the first direction by a first control signal line. At least two of the second switching parts are connected in series in the second direction by a second control signal line.

12 Claims, 9 Drawing Sheets

(56) References Cited

OTHER PUBLICATIONS

Chinese Office Action dated Dec. 15, 2017 in Chinese Patent Application No. 201510103308.3.
Office Action dated Aug. 27, 2018 in Chinese Patent Application No. 201510103308.3.

* cited by examiner

MAGNETIC RESONANCE IMAGING APPARATUS AND RADIO FREQUENCY COIL UNIT

CROSS REFERENCES TO RELATED APPLICATIONS

This application is based upon and claims the benefit of priority from Japanese Patent Application No. 2014-046219 filed on Mar. 10, 2014; the entire contents of which are incorporated herein by reference.

FIELD

Embodiments described herein relate generally to an MRI (magnetic resonance imaging) apparatus and an RF (radio frequency) coil unit.

BACKGROUND

The MRI apparatus is an imaging diagnostic apparatus which magnetically excites nuclear spins of an object set in a static magnetic field with RF signals having the Larmor frequency and reconstructs images based on MR (magnetic resonance) signals generated due to the excitation.

In an MRI apparatus, a PAC (phased array coil) in which many coil elements are arranged is often used as a reception RF coil of MR signals. In recent years, the number of coil elements included in a PAC tends to increase and there is a demand for selecting and using desired coil elements. Accordingly, a variety of techniques for switching coil elements used for an imaging are devised.

An object of the present invention is to provide a magnetic resonance imaging apparatus and an RF coil unit which can switch coil elements with a simpler configuration.

DETAILED DESCRIPTION

In general, according to one embodiment, a radio frequency coil unit includes coil elements, first switching parts and second switching parts. The coil elements are arranged in a first direction and a second direction. Each of the first switching parts and each of the second switching parts are installed in a corresponding coil element of the coil elements and switch the corresponding coil element between an on state and an off state. At least two of the first switching parts are connected in series in the first direction by a first control signal line. At least two of the second switching parts are connected in series in the second direction by a second control signal line.

Further, according to another embodiment, a radio frequency coil unit includes coil elements and switching parts. The coil elements are arranged in a matrix. The switching parts are each provided in a corresponding coil element of the coil elements and switch the corresponding coil element between an on state and an off state. Specific switching parts, on specific coil elements, out of the switching parts are connected in series by a signal line. The specific coil elements are out of the coil elements and arranged in a same column or a same row.

Further, according to another embodiment, a magnetic resonance imaging apparatus includes the above mentioned radio frequency coil unit and an imaging system. The imaging system is configured to perform magnetic resonance imaging of an object using the radio frequency coil unit.

A magnetic resonance imaging apparatus and an RF coil unit according to embodiments of the present invention will be described with reference to the accompanying drawings.

Figure 1:
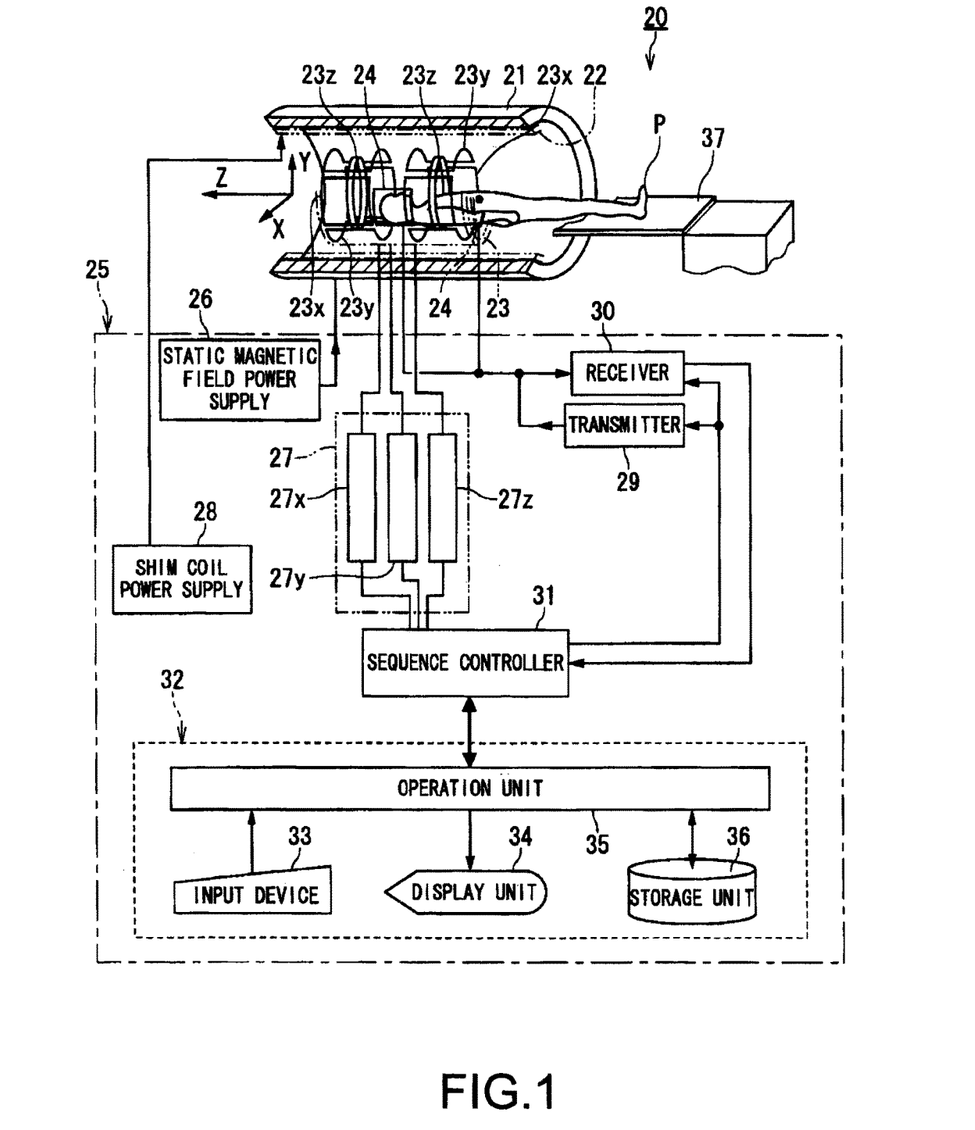
FIG. 1 is a block diagram showing a magnetic resonance imaging apparatus according to an embodiment of the present invention.

FIG. 1 is a block diagram showing a magnetic resonance imaging apparatus according to an embodiment of the present invention.

A magnetic resonance imaging apparatus 20 includes a cylinder-shaped static field magnet 21, a shim coil 22, a gradient coil 23 and RF coils 24. The static field magnet 21 generates a static magnetic field. The shim coil 22 is arranged inside the static field magnet 21.

The magnetic resonance imaging apparatus 20 also includes a control system 25. The control system 25 includes a static magnetic field power supply 26, a gradient power supply 27, a shim coil power supply 28, a transmitter 29, a receiver 30, a sequence controller 31 and a computer 32. The gradient power supply 27 of the control system 25 includes an X-axis gradient power supply 27x, a Y-axis gradient power supply 27y and a Z-axis gradient power supply 27z. The computer 32 includes an input device 33, a display unit 34, an operation unit 35 and a storage unit 36.

The static field magnet 21 communicates with the static magnetic field power supply 26. The static magnetic field power supply 26 supplies electric current to the static field magnet 21 to generate a static magnetic field in an imaging region. The static field magnet 21 includes a superconductivity coil in many cases. The static field magnet 21 gets current from the static magnetic field power supply 26 which communicates with the static field magnet 21 at excitation. However, once excitation has been made, the static field magnet 21 is usually isolated from the static magnetic field power supply 26. The static field magnet 21 may include a permanent magnet which makes the static magnetic field power supply 26 unnecessary.

The static field magnet 21 has the cylinder-shaped shim coil 22 coaxially inside itself. The shim coil 22 communicates with the shim coil power supply 28. The shim coil power supply 28 supplies current to the shim coil 22 so that the static magnetic field becomes uniform.

The gradient coil 23 includes an X-axis gradient coil 23x, a Y-axis gradient coil 23y and a Z-axis gradient coil 23z. Each of the X-axis gradient coil 23x, the Y-axis gradient coil 23y and the Z-axis gradient coil 23z, which is cylinder-shaped, is arranged inside the static field magnet 21. The gradient coil 23 has also a bed 37 in the area formed inside it which is an imaging area. The bed 37 supports an object P. The RF coils 24 include a WBC (whole body coil), which is built in a gantry, for transmission and reception of RF signals and local coils, which are arranged around the bed 37 or the object P, for reception of RF signals.

The gradient coil 23 communicates with the gradient power supply 27. The X-axis gradient coil 23x, the Y-axis gradient coil 23y and the Z-axis gradient coil 23z of the gradient coil 23 communicate with the X-axis gradient power supply 27x, the Y-axis gradient power supply 27y and the Z-axis gradient power supply 27z of the gradient power supply 27 respectively.

The X-axis gradient power supply 27x, the Y-axis gradient power supply 27y and the Z-axis gradient power supply 27z supply currents to the X-axis gradient coil 23x, the Y-axis gradient coil 23y and the Z-axis gradient coil 23z respectively so as to generate gradient magnetic fields Gx, Gy and Gz in the X, Y and Z directions in the imaging area.

The RF coils 24 communicate with the transmitter 29 and/or the receiver 30. The transmission RF coil 24 transmits RF signals given from the transmitter 29 to the object P. The reception RF coil 24 receives MR signals generated due to nuclear spins inside the object P which are excited by the RF signals to give to the receiver 30.

Figure 2:
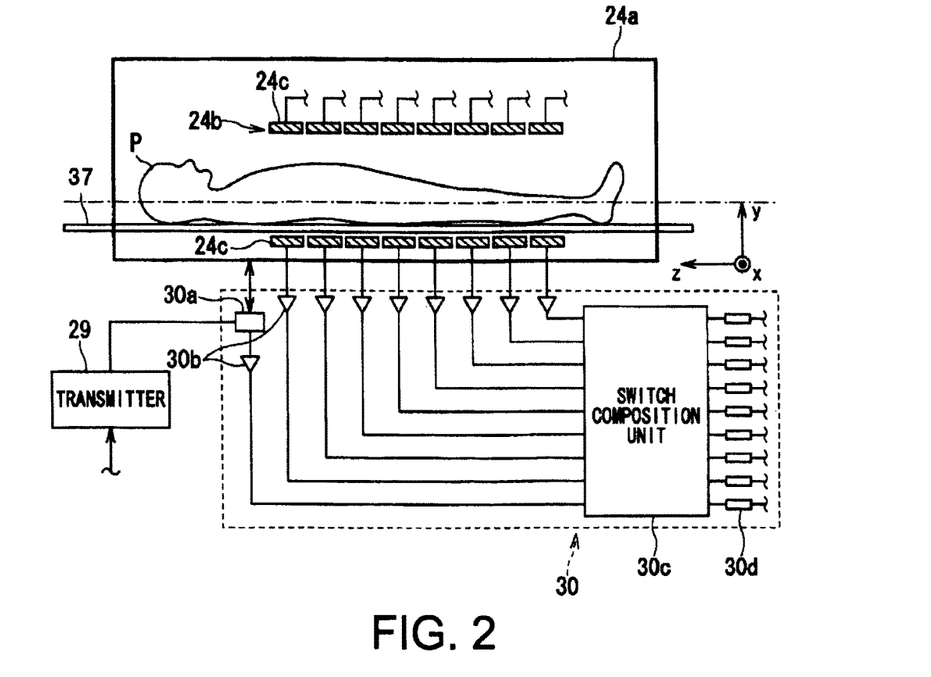
FIG. 2 is a diagram showing an example of detail structure of the RF coils shown in FIG. 1.
Figure 3:
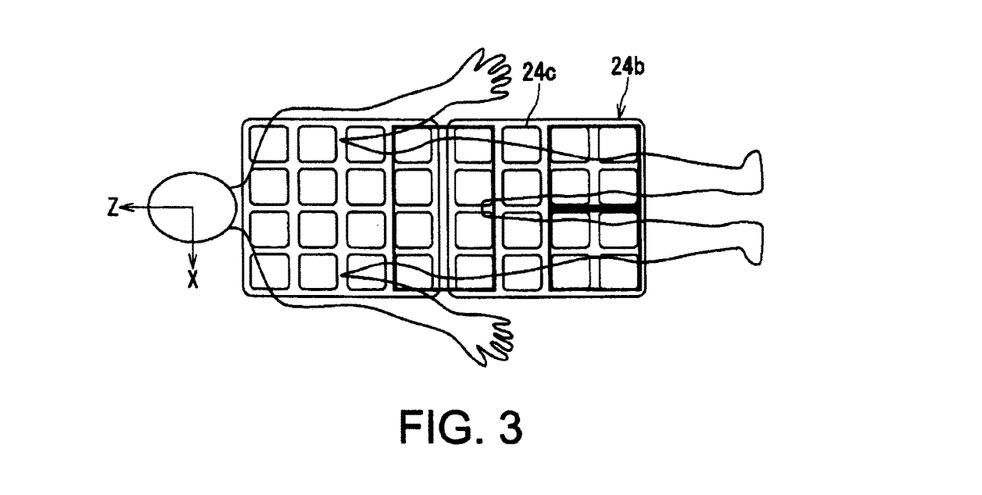
FIG. 3 shows an example of coil elements arranged on the body surface side of the object shown in FIG. 2.

FIG. 2 is a diagram showing an example of detail structure of the RF coils 24 shown in FIG. 1. FIG. 3 shows an example of coil elements 24c arranged on the body surface side of the object P shown in FIG. 2.

As shown in FIG. 2, the RF coils 24 include a cylindrical WB (whole-body) coil 24a and a phased array coil 24b. The phased array coil 24b includes plural coil elements 24c, and coil elements 24c are arranged on each of the body surface side and the back surface side of the object P. For example, as shown in FIG. 3, four rows of the coil elements 24c are provided in the x-direction and eight columns of the coil elements 24c in the z-direction, that is, a total of 32 pieces of the coil elements 24c are arranged on the body surface side of the object P so as to cover a wide-ranging imaging area.

On the other hand, the receiver 30 includes a duplexer 30a, preamplifiers 30b, a switch composition unit 30c, and reception circuits 30d. The duplexer 30a is connected to the transmitter 29, the WB coil 24a, and the preamplifier 30b for the WB coil 24a. The preamplifiers 30b are provided by the total number of the coil elements 24c and the WB coil 24a, and connected to the coil elements 24c and the WB coil 24a respectively. The switch composition unit 30c consists of a single piece or a plurality of pieces. The input side of the switch composition unit 30c is connected to the coil elements 24c or the WB coil 24a through the preamplifiers 30b. The reception circuits 30d are provided by a desired number so as to be smaller than or equal to the total number of the coil elements 24c and the WB coil 24a, and disposed on the output side of the switch composition unit 30c.

The WB coil 24a can be used as a coil for a transmission of RF signals. As a coil for a reception of MR signals, each of the coil elements 24c can be used. Furthermore, the WB coil 24a can also be used for a receiving coil.

Therefore, the duplexer 30a is configured so as to provide the WB coil 24a with RF signals for transmission, output from the transmitter 29, while providing the switch composition unit 30c with MR signals received in the WB coil 24a via the preamplifiers 30b in the receiver 30. An MR signal received in each of the coil elements 24c is output to the switch composition unit 30c via a respective one of the preamplifiers 30b.

The switch composition unit 30c is configured so as to perform composition processing and switching with respect to MR signals received from the coil elements 24c or the WB coil 24a, and to output them to the corresponding reception circuits 30d. In other words, the switch composition unit 30c is configured to perform the composition processing and switching with respect to MR signals received from the coil elements 24c or the WB coil 24a, in conformance with the number of the reception circuits 30d, so that MR signals can be received from various imaging parts by forming a sensibility distribution according to an imaging part, using desired coil elements 24c.

However, MR signals may be received by the WB coil 24a alone without providing the coil elements 24c. Alternatively, MR signals received in the coil elements 24c or the WB coil 24a may be directly output to the reception circuits 30d without providing the switch composition unit 30c. Furthermore, more coil elements 24c may be extensively arranged.

Figure 4:
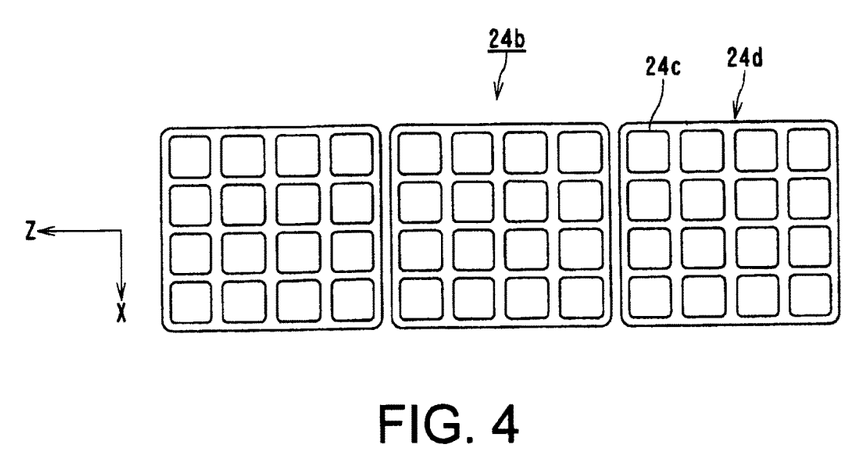
FIG. 4 shows another arrangement example of the coil elements set on the body surface side of the object shown in FIG. 2.

FIG. 4 shows another arrangement example of the coil elements 24c set on the body surface side of the object P shown in FIG. 2.

As shown in FIG. 4, further more coil elements 24c may be arranged around the object P. In an example shown in FIG. 4, three coil units 24d are arranged in the z-direction. Each of the coil units 24d consists of 16 elements of the coil elements 24c which are arranged at four columns in the x-direction and four rows in the z-direction. That is, a total of 48 elements of the coil elements 24c are arranged on the body surface side of the object P.

Arranging a multitude of the coil elements 24c around the object P makes it possible to form the phased array coil 24b for the whole-body, capable of receiving data from imaging parts without moving positions of the coils or that of the object P. Although the WB coil 24a can also receive data from imaging parts without moving positions of the coils or that of the object P, the use of the phased array coil 24b for the whole-body as a receiving coil allows receiving data with sensitivities more suitable for the imaging parts and with a better SNR (signal to noise ratio).

The sequence controller 31 of the control system 25 communicates with the gradient power supply 27, the transmitter 29 and the receiver 30. The sequence controller 31 stores sequence information describing control information needed in order to drive the gradient power supply 27, the transmitter 29 and the receiver 30, and generates gradient magnetic fields Gx, Gy and Gz in the X, Y and Z directions and RF signals by driving the gradient power supply 27, the transmitter 29 and the receiver 30 according to a predetermined stored sequence. The above-described control information includes motion control information, such as intensities, application durations and application timings of electric current pulses which should be applied to the gradient power supply 27.

The sequence controller 31 is also configured to give raw data to the computer 32. The raw data, which are complex-valued data, are generated by the receiver 30 performing detection and A/D (analog to digital) conversion of MR signals.

The transmitter 29 gives RF signals to the RF coil 24 in accordance with control information provided from the sequence controller 31. Meanwhile, the receiver 30 performs detection, necessary signal processing and A/D conversion of MR signals given from the RF coils 24 to generate raw data which are digitized complex-valued data. The generated raw data are given from the receiver 30 to the sequence controller 31.

The computer 32 has various functions by the operation unit 35 executing programs stored in the storage unit 36 of the computer 32. Alternatively, specific circuits having various functions may be provided to the magnetic resonance imaging apparatus 20, instead of at least a part of the computer programs.

Specifically, the computer 32 has a function to set imaging conditions including a pulse sequence, output the set imaging conditions to predetermined elements, such as the sequence controller 31, and generate MR image data based on MR signals obtained through the sequence controller 31.

The magnetic resonance imaging apparatus 20 has a function as an imaging system for performing MR imaging of an object P, by cooperation of hardware, such as the static field magnet 21, the shim coil 22, the gradient coil 23 and the RF coils 24, and the control system 25 including the computer 32. However, so long as the function as the imaging system for performing MR imaging of an object P is provided with the magnetic resonance imaging apparatus 20, the imaging system can be configured by arbitrary elements.

The magnetic resonance imaging apparatus 20 also has a function to switch the coil elements 24c of the phased array coil 24b installed as the reception RF coil 24.

Figure 5:
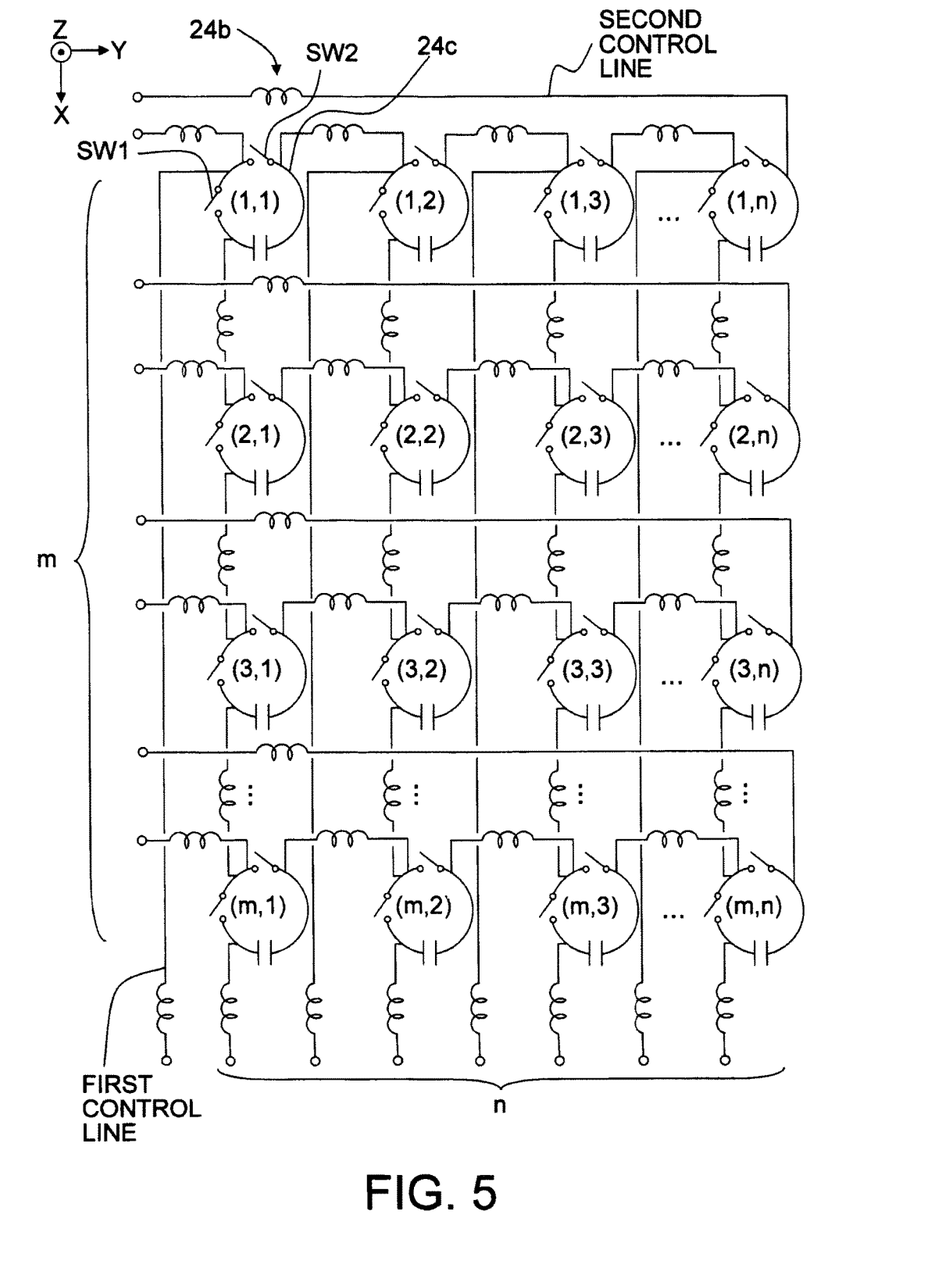
FIG. 5 shows an example of circuit configuration of the phased array coil installed as the RF coil shown in FIG. 1.

FIG. 5 shows an example of circuit configuration of the phased array coil 24b installed as the RF coil 24 shown in FIG. 1.

As shown in FIG. 5, the coil elements 24c which configure the phased array coil 24b can be arranged in the first direction and the second direction. The second direction is an arbitrary direction which differs from the first direction.

In an example shown in FIG. 5, m pieces of the coil elements 24 are arranged in the X-axis direction, and n pieces of the coil elements 24c are arranged in the Y-axis direction. In other words, the phased array coil 24b exemplified in FIG. 5 consists of m×n pieces of the coil elements 24c. Specifically, m pieces of the coil elements 24c are arranged in the X-axis direction as an example of the first direction while n pieces of the coil elements 24c are arranged in the Y-axis direction as an example of the second direction.

In this case, the respective coil elements 24c can be expressed using a two dimensional matrix of m rows and n columns (m×n). Specifically, each coil element 24c can be specified using a coordinate (i, j). Note that, i=1, 2, 3, . . . , m, and j=1, 2, 3, . . . , n.

Each coil element 24c has the first switching part SW1 and the second switching part SW2 which switch the coil element 24c between the ON state and the OFF state, respectively. Therefore, the two switching parts, consisting of the first switching part SW1 and the second switching part SW2, for controlling ON/OFF of the coil element 24c are connected with each other in series on each of the coil elements 24c.

At least two of the first switching parts SW1 are connected with each other in series by the first signal line for control. Meanwhile, at least two of the second switching parts SW2 are also connected with each other in series by the second signal line for control. The second signal line is another signal line which is independent from the first signal line.

That is, the phased array coil 24b has the first switching parts SW1 and the second switching parts SW2. The first switching parts SW1 switch the coil elements 24c respectively between the ON state and the OFF state, and at least two of the first switching parts SW1 are connected with each other in series in the first direction by the first signal line for control. The second switching parts SW2 switch the coil elements 24c respectively between the ON state and the OFF state, and at least two of the second switching parts SW2 are connected with each other in series in the second direction by the second signal line for control. That is, the first switching parts SW1 on the coil elements 24c arranged in the same column are connected in series by the first signal line while the second switching parts SW2 on the coil elements 24c arranged in the same row are connected in series by the second signal line.

Then, it is possible to control ON/OFF of each coil element 24c by a few signal lines and control signals, compared with a case of controlling ON/OFF of each coil element 24c by installing an independent switching part on each coil element 24c. Specifically, coil elements 24c used for receiving MR signals can be selected by switching control of the first switching parts SW1, of which at least two are mutually connected in series, and the second switching parts SW2, of which at least two are mutually connected in series.

It is preferable from a viewpoint of reducing the required number of signal lines and control signals that n pieces of the first switching element groups are formed by connecting m pieces of the first switching parts SW1 in series in the X-axis direction as an example of the first direction while m pieces of the second switching element groups are formed by connecting n pieces of the second switching parts SW2 in series in the Y-axis direction as an example of the second direction, as exemplified in FIG. 5.

In this case, the required number of the signal lines and the control signals is m+n. On the condition that ON/OFF of each coil element 24c is controlled by an independent signal line and control signal, the required number of the signal lines and the control signals is m×n. Therefore, the number of the signal lines and the control signals required for the ON/OFF controls of the respective coil elements 24c can be reduced by the series connection of the first switching parts SW1 arranged in the X-axis direction and the series connection of the second switching parts SW2 arranged in the Y-axis direction, as shown in FIG. 5.

The ON/OFF controls of the respective coil elements 24c can be performed by outputting ON signals to required signal lines so that both the first switching parts SW1 and the second switching parts SW2 set in coil elements 24c which should operate for receiving MR signals become the ON state. As a specific example, when the four coil elements 24c whose coordinates are (i, j), (i, j+1), (i+1, j) and (i+1, j+1) are used for receiving MR signals, ON signals have only to be output to the signal lines in the i-th row, the i+1-th row, the j-th column and the j+1-th column, respectively.

In the example shown in FIG. 5, the coil elements 24c are arranged on the XY plane, which is a two dimensional plane. However, a similar circuit configuration can also be adopted when the coil elements 24c are arranged on a curved surface which can be developed into a two dimensional plane. Each coil element 24c may also be a figure-of-eight coil or a coil whose coil wire intersects at not less than two positions.

Figure 6:
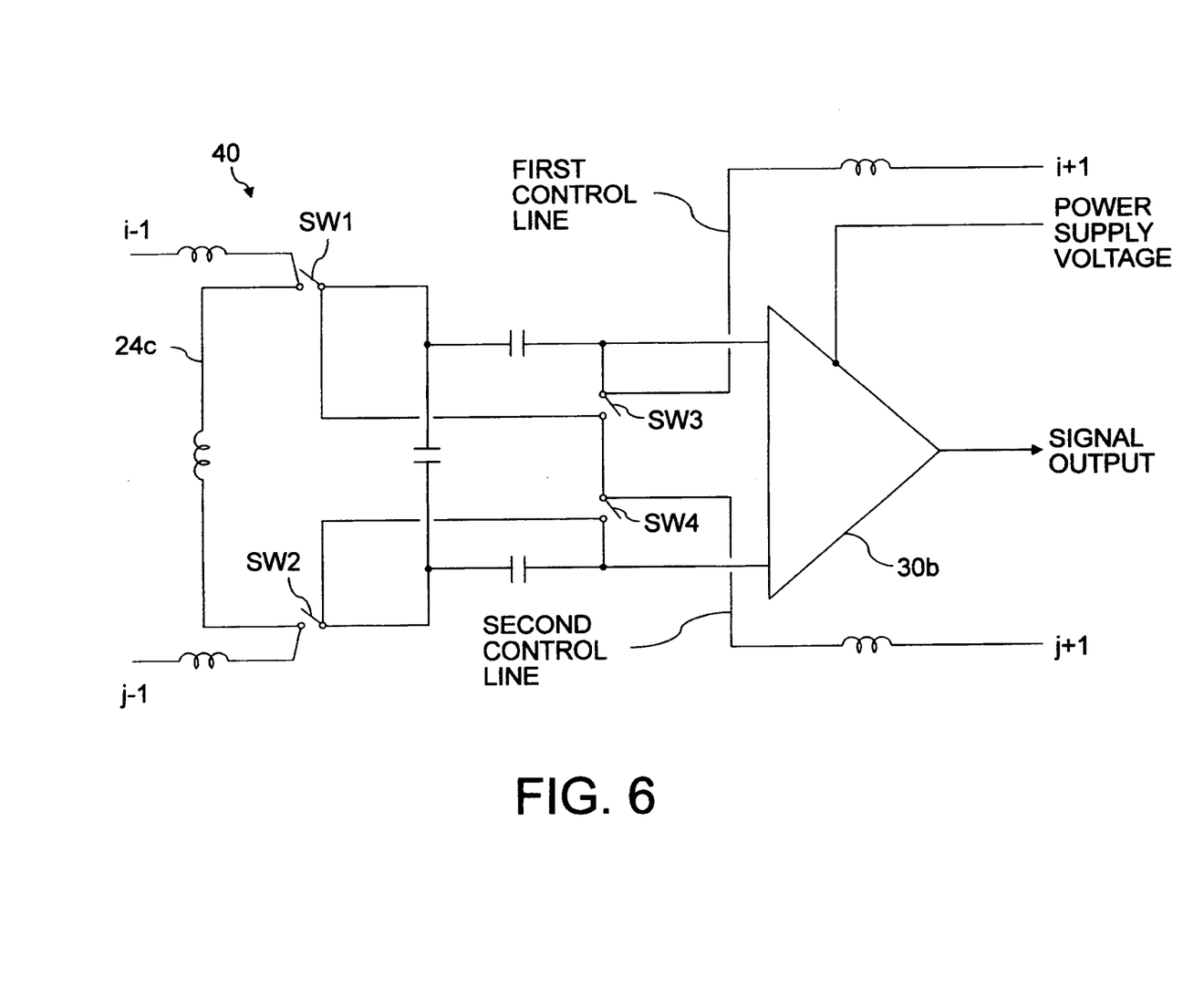
FIG. 6 is a circuit diagram showing an example of detailed structure in a connection part between a certain coil element shown in FIG. 5 and the preamplifier.

FIG. 6 is a circuit diagram showing an example of detailed structure in a connection part between a certain coil element 24c shown in FIG. 5 and the preamplifier 30b.

As shown in FIG. 6, each coil element 24c is connected with the preamplifier 30b which amplifies MR signals received by the corresponding coil element 24c. Note that, a removable RF coil unit 40 which can be attached and detached to reception channels of the magnetic resonance imaging apparatus 20 may also be composed using the phased array coil 24b, which consists of the coil elements 24c, and the preamplifiers 30b. In other words, the preamplifiers 30b may also be built in the RF coil unit 40.

As described with reference to FIG. 5, the first switching part SW1 and the second switching part SW2 are arranged on the main receiving loop which composes each coil element 24c. Furthermore, the third switching part SW3 and the fourth switching part SW4 can be mutually connected in series between input terminals of the preamplifier 30b. The third switching part SW3 is connected with the corresponding first switching part SW1 in series by the first signal line. Meanwhile, the fourth switching part SW4 is connected with the corresponding second switching part SW2 in series by the second signal line.

The first switching part SW1 and the third switching part SW3 in the i-th row are connected with the first switching part SW1 and the third switching part SW3 in the i–1-th row belonging to the same column, and with the first switching part SW1 and the third switching part SW3 in the i+1-th row belonging to the same column, in series by the first signal line. Meanwhile, the second switching part SW2 and the fourth switching part SW4 in the j-th column are connected with the second switching part SW2 and the fourth switching part SW4 in the j–1-th column belonging to the same row, and with the second switching part SW2 and the fourth switching part SW4 in the j+1-th column belonging to the same row, in series by the second signal line.

Then, the third switching parts SW3 open and close in conjunction with opening and closing of the first switching parts SW1. Meanwhile, the fourth switching parts SW4 also open and close in conjunction with opening and closing of the second switching parts SW2. When neither the third switching part SW3 nor the fourth switching part SW4 is in the ON state, the input sides of the corresponding preamplifier 30b short out. Therefore, when at least one of the first switching part SW1 and the second switching part SW2 is in the OFF state, at least one of the third switching part SW3 and the fourth switching part SW4 also becomes the OFF state, which results in a short in the input sides of the preamplifier 30b. Therefore, the stability in operation of the preamplifier 30b can be improved.

Figure 7:
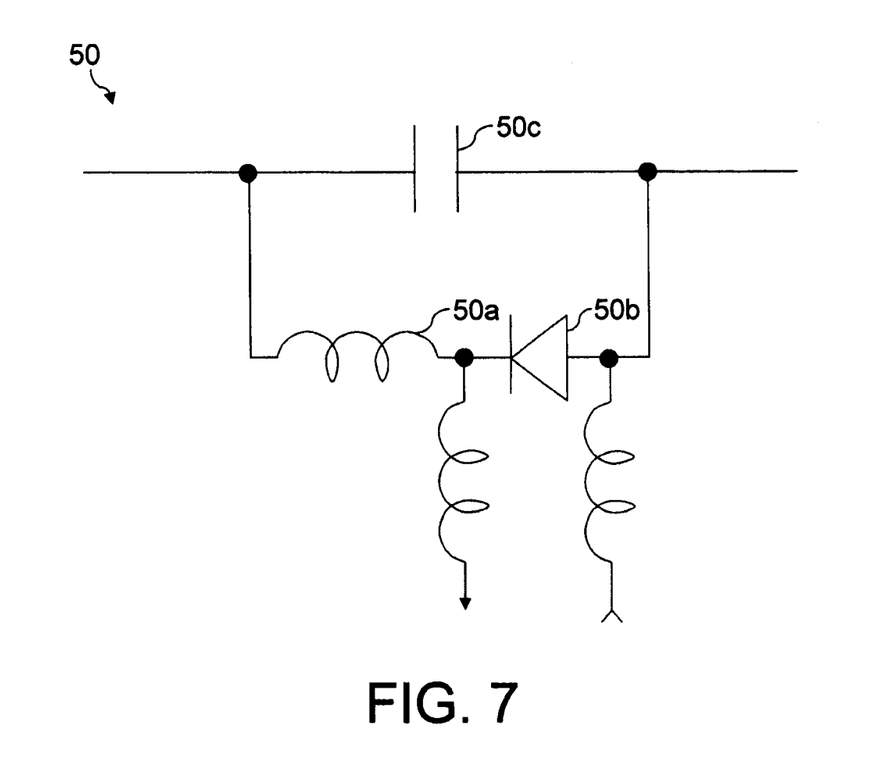
FIG. 7 is a circuit diagram showing an example of switching circuit which can be used as the first switching part SW1, the second switching part SW2, the third switching part SW3, and the fourth switching part SW4 shown in FIG. 6.

FIG. 7 is a circuit diagram showing an example of switching circuit which can be used as the first switching part SW1, the second switching part SW2, the third switching part SW3, and the fourth switching part SW4 shown in FIG. 6.

A switching circuit 50 which can be used as the first switching part SW1, the second switching part SW2, the third switching part SW3, and the fourth switching part SW4 can be composed of an inductor 50a, a switching circuit element 50b, such as a PIN (positive intrinsic negative) diode, a capacitor 50c, and control signal lines, as exemplified in FIG. 7. In an example shown in FIG. 7, the switching circuit element 50b is connected with the inductor 50a in series. The capacitor 50c is connected with the inductor 50a and the switching circuit element 50b in parallel. Note that, only a part of the switching circuits 50 may have the circuit configuration as described above. In other words, at least one of the switching circuits 50 can be made by the circuit configuration as described above.

Figure 8:
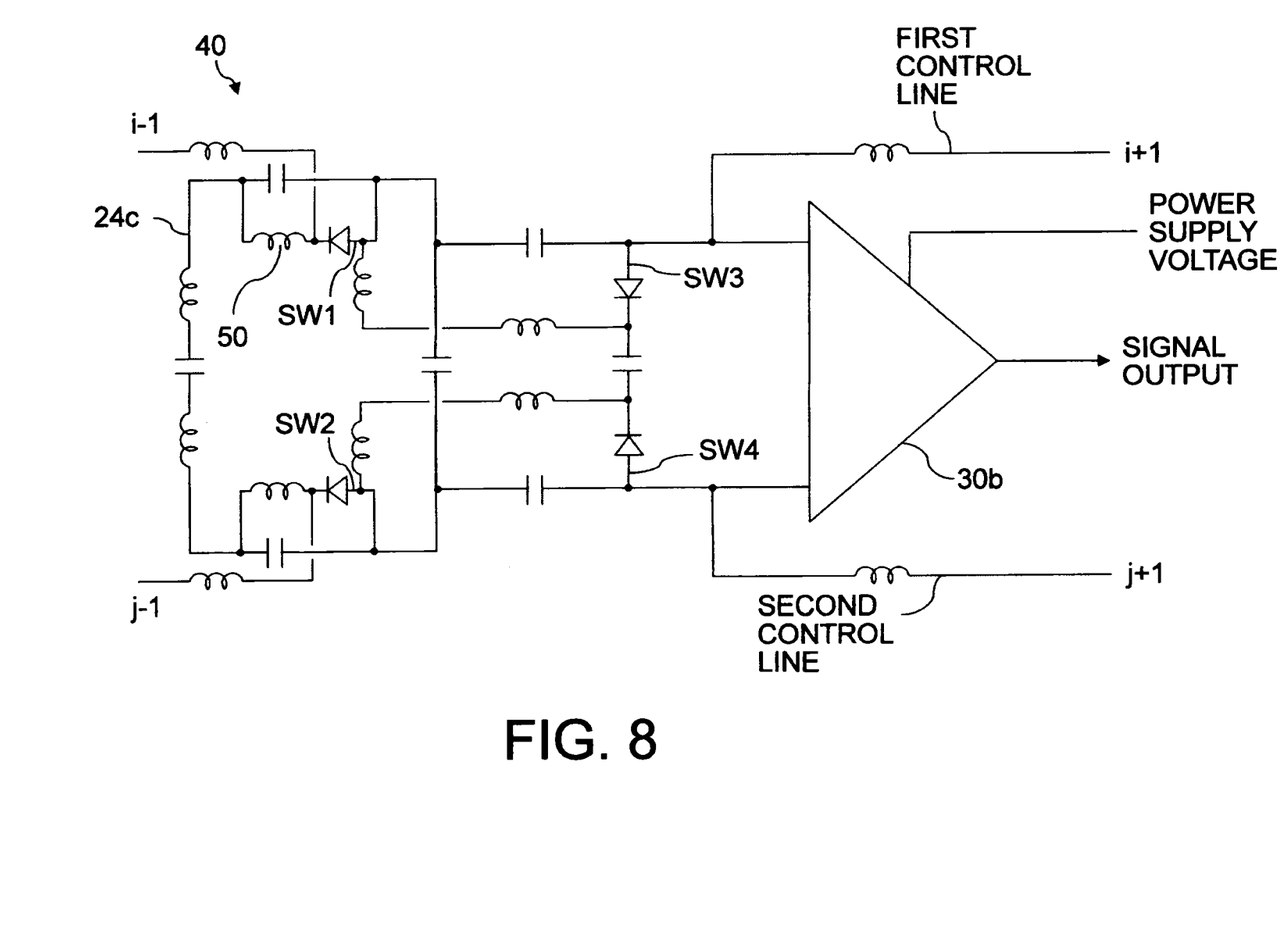
FIG. 8 is a circuit diagram showing an example of composing the RF coil unit shown in FIG. 6, using the switching circuits shown in FIG. 7.

FIG. 8 is a circuit diagram showing an example of composing the RF coil unit 40 shown in FIG. 6, using the switching circuits 50 shown in FIG. 7.

As shown in FIG. 8, the switching circuit 50 shown in FIG. 7 can be used as each of the first switching part SW1 and the second switching part SW2 which are shown in FIG. 6. Each of the third switching part SW3 and the fourth switching part SW4 can use a switching circuit element, such as a PIN diode.

Figure 9:
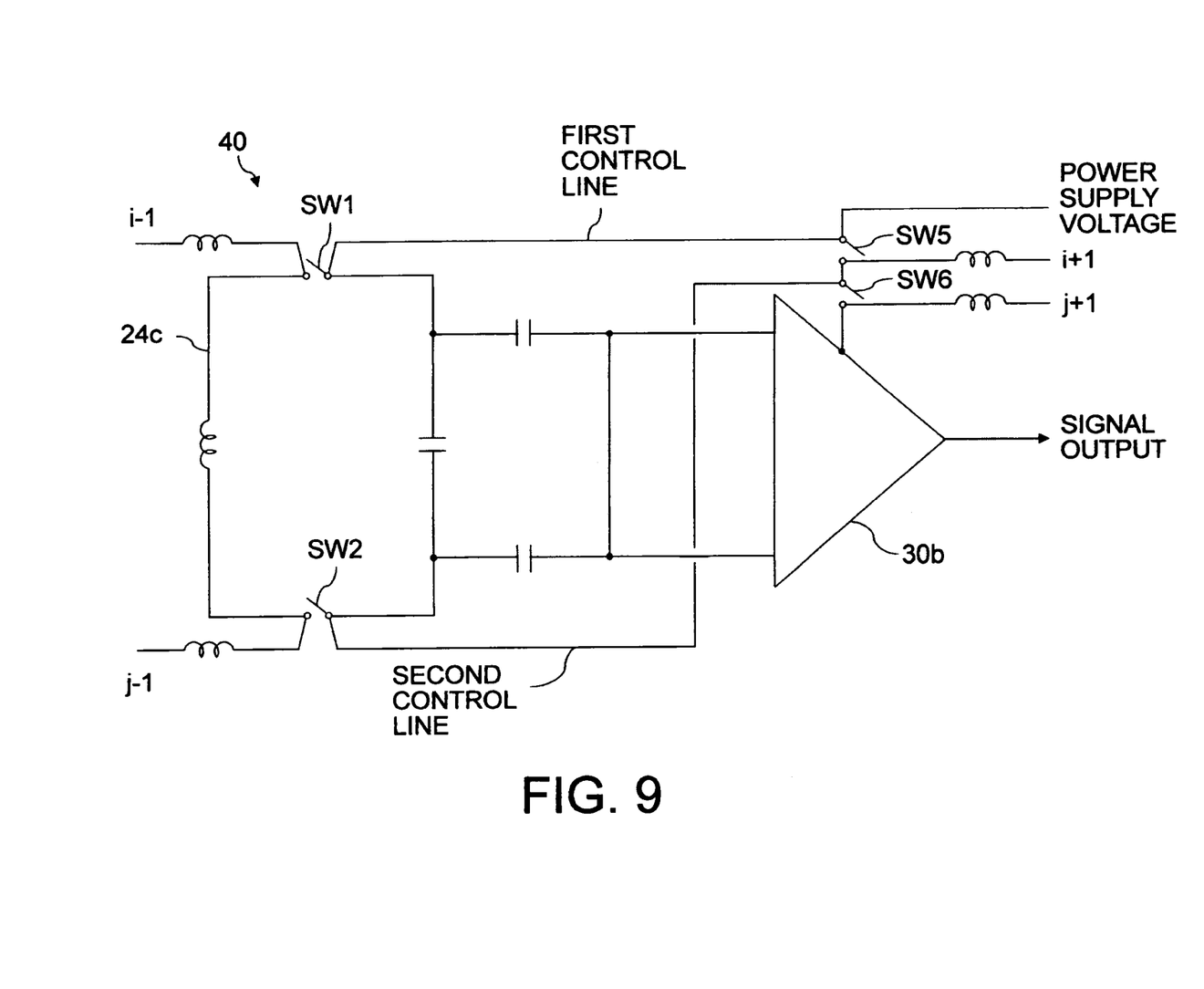
FIG. 9 is a circuit diagram showing another example of detailed structure in a connection part between a certain coil element shown in FIG. 5 and the preamplifier.

FIG. 9 is a circuit diagram showing another example of detailed structure in a connection part between a certain coil element 24c shown in FIG. 5 and the preamplifier 30b.

Instead of connecting the third switching part SW3 and the fourth switching part SW4 between the input terminals of the preamplifier 30b, the fifth switching part SW5 and the sixth switching part SW6 may be mutually connected in series on the power supply line of the preamplifier 30b, as shown in FIG. 9. The fifth switching parts SW5 are connected with the first switching parts SW1 in series by the first signal line. Meanwhile, the sixth switching parts SW6 are connected with the second switching parts SW2 in series by the second signal line.

The first switching part SW1 and the fifth switching part SW5 in the i-th row are connected with the first switching part SW1 and the fifth switching part SW5 in the i–1-th row belonging to the same column, and with the first switching part SW1 and the fifth switching part SW5 in the i+1-th row belonging to the same column, in series by the first signal line. Meanwhile, the second switching part SW2 and the sixth switching part SW6 in the j-th column are connected with the second switching part SW2 and the sixth switching part SW6 in the j–1-th column belonging to the same row, and with the second switching part SW2 and the sixth switching part SW6 in the j+1-th column belonging to the same row, in series by the second signal line.

Then, the fifth switching parts SW5 open and close in conjunction with opening and closing of the first switching parts SW1. Meanwhile, the sixth switching parts SW6 also open and close in conjunction with opening and closing of the second switching parts SW2. When neither the fifth switching part SW5 nor the sixth switching part SW6 is in the ON state, a supply of a power supply voltage to the corresponding preamplifier 30b is cut off. Therefore, the corresponding preamplifier 30b becomes the OFF state.

Therefore, when at least one of the first switching part SW1 and the second switching part SW2 is in the OFF state, at least one of the fifth switching part SW5 and the sixth switching part SW6 also becomes the OFF state, which results in the OFF state of the preamplifier 30b. Therefore, the stability in operation of the preamplifier 30b can be improved.

Figure 10:
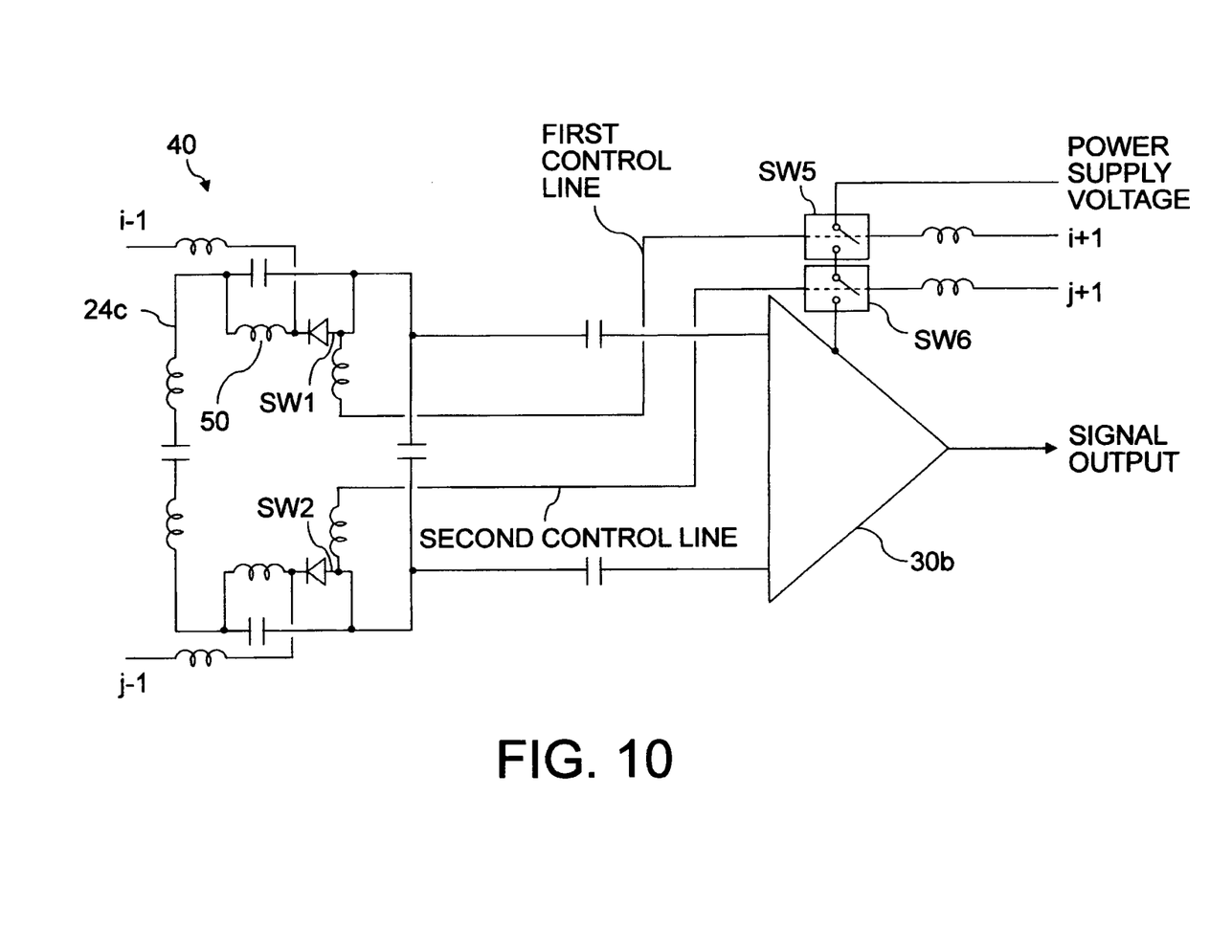
FIG. 10 is a circuit diagram showing an example of composing the RF coil unit shown in FIG. 9, using the switching circuits shown in FIG. 7.

FIG. 10 is a circuit diagram showing an example of composing the RF coil unit 40 shown in FIG. 9, using the switching circuits 50 shown in FIG. 7.

As shown in FIG. 10, the switching circuit 50 shown in FIG. 7 can be used as each of the first switching part SW1 and the second switching part SW2 which are set in the RF coil unit 40 shown in FIG. 9. Meanwhile, an analog switch can be used as a switching circuit for each of the fifth switching part SW5 and the sixth switching part SW6 which are set in the RF coil unit 40 shown in FIG. 9.

Then, MR imaging of an object P can be performed using the RF coil unit 40 which has structures as described above. Specifically, switching controls of the respective switching parts SW1, SW2, SW3, SW4, SW5 and SW6 arranged in the RF coil unit 40 can be performed according to imaging conditions set in the computer 32. The control signals, for controlling the opening and closing of the respective switching parts SW1, SW2, SW3, SW4, SW5 and SW6, which are output to the first and second control signal lines can be output from the computer 32 through the sequence controller 31.

As described above, the RF coil unit 40 has the coil elements 24c arranged in a matrix and switching parts, respectively set in the coil elements 24c, for switching between the ON state and the OFF state of the coil elements 24c. Further, the switching parts of the coil elements 24c arranged in the same column or row are connected with each other in series by a signal line. Therefore, according to the magnetic resonance imaging apparatus 20 and the RF coil unit 40, the coil elements 24c used for receiving MR signals can be switched with a simpler circuit configuration. Specifically, desired coil elements 24c to be used for data receptions can be selected from among the coil elements 24c with less control lines and control signals.

Especially, when the phased array coil 24b having m×n pieces of the coil elements 24c is used for imaging, the ON/OFF controls of the desired coil elements 24c can be performed using m+n pieces of control systems far fewer than m×n pieces of control systems whose number is same as the number of the coil elements 24c.

Further, compared with the conventional RF coil unit having an independent switching part in each coil element for the ON/OFF control of the coil element, the RF coil unit 40 can reduce the number of signal lines. Therefore, the RF coil unit 40 can be flexibly deformed according to a shape of an object P and an imaging purpose. Especially, when the coil elements 24c are arranged on a curved surface which can be developed to a two dimensional plane, the easiness in deformation of the RF coil unit 40 is useful.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A radio frequency coil unit comprising:
coil elements arranged in a first direction and a second direction; and
first switching parts and second switching parts, each of said first switching parts and each of said second switching parts being installed in a corresponding coil element of said coil elements and switching between an on state and an off state, at least two of said first switching parts being connected in series in the first direction by a first control signal line, at least two of said second switching parts being connected in series in the second direction by a second control signal line,
wherein each of said coil elements is enabled to receive MR (magnetic resonance) signals in a condition that both the first switching part and the second switching part, corresponding to the each of said coil elements, are in an ON state; and
further comprising:
an amplifier amplifying magnetic resonance signals received by the corresponding coil element;
a third switching part connected in series with the at least two of said first switching parts by the first signal line and connected between input terminals of said amplifier; and
a fourth switching part connected in series with the at least two of said second switching parts by the second signal line and connected, in series with said third switching part, between the input terminals of said amplifier.

2. A radio frequency coil unit of claim 1,
wherein said coil elements are arranged on a two dimensional plane or a curved surface which can be developed to the two dimensional plane or another two dimensional plane.

3. A radio frequency coil unit of claim 1,
wherein n pieces of a first switching element groups are formed by connecting m pieces of said first switching parts in series in the first direction while m pieces of a second switching element groups are formed by connecting n pieces of said second switching parts in series in the second direction.

4. A radio frequency coil unit of claim 1,
wherein each of said first switching parts and each of said second switching parts are arranged on a main receiving loop of each of said coil elements.

5. A radio frequency coil unit of claim 1,
wherein at least one of said first switching parts and second switching parts includes:
an inductor;
a switching circuit element connected in series with said inductor;
a capacitor connected in parallel with said inductor and said switching circuit element.

6. A magnetic resonance imaging apparatus comprising:
a radio frequency coil unit of claim 1; and
an imaging system configured to perform magnetic resonance imaging of an object using said radio frequency coil unit.

7. A radio frequency coil unit, comprising:
coil elements arranged in a first direction and a second direction; and
first switching parts and second switching parts each of said first switching parts and each of said second switching parts being installed in a corresponding coil element of said coil elements and switching between an on state and an off state, at least two of said first switching parts being connected in series in the first direction by a first control signal line, at least two of said second switching parts being connected in series in the second direction by a second control signal line,
wherein each of said coil elements is enabled to receive MR (magnetic resonance) signals in a condition that both the first switching part and the second switching part, corresponding to the each of said coil elements, are in an ON state; and
further comprising:
an amplifier amplifying magnetic resonance signals received by the corresponding coil element;
a third switching part connected in series with the at least two of said first switching parts by the first signal line and connected on a power supply line of said amplifier; and a fourth switching part connected in series with the at least two of said second switching parts by the second signal line and connected, in series with said third switching part, on the power supply line of said amplifier.

8. A radio frequency coil unit of claim 7, wherein said coil elements are arranged on a two dimensional plane or a curved surface which can be developed to the two dimensional plane or another two dimensional plane.

9. A radio frequency coil unit of claim 7, wherein n pieces of a first switching element groups are formed by connecting m pieces of said first switching parts in series in the first direction while m pieces of a second switching element groups are formed by connecting n pieces of said second switching parts in series in the second direction.

10. A radio frequency coil unit of claim 7, wherein each of said first switching parts and each of said second switching parts are arranged on a main receiving loop of each of said coil elements.

11. A radio frequency coil unit of claim 7, wherein at least one of said first switching parts and second switching parts includes:

an inductor;

a switching circuit element connected in series with said inductor;

a capacitor connected in parallel with said inductor and said switching circuit element.

12. A magnetic resonance imaging apparatus comprising:

a radio frequency coil unit of claim 7; and an imaging system configured to perform magnetic resonance imaging of an object using said radio frequency coil unit.

* * * * *